United States Patent
Gauthier, Jr. et al.

(10) Patent No.: US 8,138,546 B2
(45) Date of Patent: Mar. 20, 2012

(54) ELECTROSTATIC DISCHARGE PROTECTION DEVICE AND METHOD OF FABRICATING SAME

(75) Inventors: Robert J. Gauthier, Jr., Hinesburg, VT (US); Junjun Li, Williston, VT (US); Souvick Mitra, Burlington, VT (US); Mahmoud A. Mousa, Poughkeepsie, NY (US); Christopher Stephen Putnam, Hinesburg, VT (US)

(73) Assignee: International Business Machines Corporation, Armonk, NY (US)

( * ) Notice: Subject to any disclaimer, the term of this patent is extended or adjusted under 35 U.S.C. 154(b) by 459 days.

(21) Appl. No.: 12/127,946

(22) Filed: May 28, 2008

(65) Prior Publication Data
US 2008/0224172 A1 Sep. 18, 2008

Related U.S. Application Data

(62) Division of application No. 11/781,370, filed on Jul. 23, 2007, now Pat. No. 7,399,665, which is a division of application No. 11/275,638, filed on Jan. 20, 2006, now Pat. No. 7,298,008.

(51) Int. Cl.
  *H01L 27/01* (2006.01)
  *H01L 27/12* (2006.01)
  *H01L 31/0392* (2006.01)
(52) U.S. Cl. ........ 257/347; 257/119; 257/356; 257/357; 257/365; 257/369
(58) Field of Classification Search .................. 257/365, 257/369, 347
See application file for complete search history.

(56) References Cited

U.S. PATENT DOCUMENTS

| | | | |
|---|---|---|---|
| 4,672,402 A * | 6/1987 | Yamaoka et al. | 257/367 |
| 4,677,735 A | 7/1987 | Malhi | |
| 5,473,169 A * | 12/1995 | Ker et al. | 257/173 |
| 5,532,175 A | 7/1996 | Racanelli et al. | |
| 5,614,433 A | 3/1997 | Mandelman | |
| 5,708,288 A * | 1/1998 | Quigley et al. | 257/355 |
| 5,828,101 A | 10/1998 | Endo | |
| 5,952,695 A | 9/1999 | Ellis-Monaghan et al. | |
| 5,965,905 A | 10/1999 | Hayashi | |
| 6,015,992 A | 1/2000 | Chatterjee et al. | |
| 6,074,899 A | 6/2000 | Voldman | |
| 6,096,584 A | 8/2000 | Ellis-Monaghan et al. | |

(Continued)

OTHER PUBLICATIONS

Notice of Allowance (Mail Date Aug. 7, 2009) for U.S. Appl. No. 12/036,319, filed Feb. 25, 2008; Confirmation No. 1779.

(Continued)

*Primary Examiner* — Wael Fahmy
*Assistant Examiner* — Sarah Salerno
(74) *Attorney, Agent, or Firm* — Schmeiser, Olsen & Watts; Anthony Canale

(57) ABSTRACT

A silicon control rectifier and an electrostatic discharge protection device of an integrated circuit including the silicon control rectifier. The silicon control rectifier includes a silicon body formed in a silicon layer in direct physical contact with a buried oxide layer of a silicon-on-insulator substrate, a top surface of the silicon layer defining a horizontal plane; and an anode of the silicon control rectifier formed in a first region of the silicon body and a cathode of the silicon control rectifier formed in an opposite second region of the silicon body, wherein a path of current flow between the anode and the cathode is only in a single horizontal direction parallel to the horizontal plane.

10 Claims, 8 Drawing Sheets

U.S. PATENT DOCUMENTS

| | | |
|---|---|---|
| 6,103,564 A | 8/2000 | Masuda |
| 6,111,289 A * | 8/2000 | Udrea ............................ 257/328 |
| 6,242,763 B1 | 6/2001 | Chen et al. |
| 6,274,910 B1 * | 8/2001 | Yu ................................. 257/355 |
| 6,573,566 B2 | 6/2003 | Ker et al. |
| 6,627,505 B2 | 9/2003 | Adan |
| 6,734,500 B2 | 5/2004 | Ebina |
| 6,750,515 B2 | 6/2004 | Ker et al. |
| 6,777,746 B2 * | 8/2004 | Kitagawa et al. .............. 257/335 |
| 6,798,021 B2 | 9/2004 | Ipposhi et al. |
| 6,872,987 B2 | 3/2005 | Yu |
| 6,894,351 B2 | 5/2005 | Okawa et al. |
| 6,909,149 B2 * | 6/2005 | Russ et al. .................... 257/355 |
| 6,964,883 B2 | 11/2005 | Chang |
| 2003/0122192 A1 * | 7/2003 | Ker et al. ....................... 257/347 |
| 2003/0146474 A1 * | 8/2003 | Ker et al. ....................... 257/347 |
| 2004/0048425 A1 | 3/2004 | Assaderaghi et al. |
| 2004/0207017 A1 | 10/2004 | Matsumoto et al. |
| 2004/0207021 A1 | 10/2004 | Russ et al. |
| 2005/0205938 A1 | 9/2005 | Yagishita |
| 2009/0140300 A1 * | 6/2009 | Usami ............................ 257/288 |

OTHER PUBLICATIONS

Office Action (Mail Date Jun. 11, 2009) for U.S. Appl. No. 12/036,319, filed Feb. 25, 2008; Confirmation No. 1779.

Office Action (Mail Date Dec. 26, 2008) for U.S. Appl. No. 12/036,319, filed Feb. 25, 2008; Confirmation No. 1779.

* cited by examiner

ELECTROSTATIC DISCHARGE PROTECTION DEVICE AND METHOD OF FABRICATING SAME

RELATED APPLICATIONS

This application is a division of U.S. patent application Ser. No. 11/781,370 filed on Jul. 23, 2007 which is a division of U.S. patent application Ser. No. 11/275,638 filed on Jan. 20, 2006 and now U.S. Pat. No. 7,298,008 issued on Nov. 20, 2007.

FIELD OF THE INVENTION

The present invention relates to the field of integrated circuits; more specifically, it relates to an electrostatic discharge (ESD) protection device for use in integrated circuits fabricated on silicon-on-insulator (SOI) substrates and a method of fabricating the ESD protection device.

BACKGROUND OF THE INVENTION

In order to meet increasing performance targets, advanced complimentary metal-oxide-silicon (CMOS) technologies are being scaled down in size to the point that sensitivity to ESD is becoming a significant reliability problem. The use of silicon control rectifiers (SCRs) to protect CMOS technologies built with bulk silicon substrates is known in the industry. However, current SCR-based ESD protection devices suffer from high junction capacitance and current crowding making them unsuitable for CMOS technologies built with SOI substrates. Therefore, there is an ongoing need for an SCR device for electrostatic discharge (ESD) protection in integrated circuits fabricated on silicon-on-insulator (SOI) substrates.

SUMMARY OF THE INVENTION

A first aspect of the present invention is a silicon control rectifier, comprising: silicon body formed in a silicon layer in direct physical contact with a buried oxide layer of a silicon-on-insulator substrate, a top surface of the silicon layer defining a horizontal plane; and an anode of the silicon control rectifier formed in a first region of the silicon body and a cathode of the silicon control rectifier formed in an opposite second region of the silicon body, wherein a path of current flow between the anode and the cathode is only in a single horizontal direction parallel to the horizontal plane.

A second aspect of the present invention is a silicon control rectifier, comprising: a silicon layer in direct physical contact with a buried oxide layer of a silicon-on-insulator substrate, a top surface of the silicon layer defining a horizontal plane; a first doped region in the silicon layer, the first doped region having a first net peak doping concentration, a second doped region having a second net peak doping concentration and a third doped region having a third net peak doping concentration, the second and third net peak doping concentrations being a same doping concentration, the first doped region between and abutting the second and third doped regions, the second and third doped regions not abutting; a fourth doped region in the silicon layer in the silicon layer, the fourth doped region having a fourth net peak doping concentration in the silicon layer, the fourth doped region abutting only the second doped region; a fifth doped region in the silicon layer, the fifth doped region having a fifth net peak doping concentration in the silicon layer, the fifth doped region abutting only the third doped region; wherein a path of current flow from the fourth doped region, through the second doped region, the first doped region and the third doped region to the fifth doped region, is in a single horizontal direction parallel to the horizontal plane.

A third aspect of the present invention is a method of fabricating a silicon control rectifier, comprising: forming a blanket doped region having a net peak doping concentration in a silicon layer in direct physical contact with a buried oxide layer of a silicon-on-insulator substrate, a top surface of the silicon layer defining a horizontal plane; forming a first doped region in the silicon layer, the first doped region having a first net peak doping concentration, the first doped region dividing the blanket doped region into a second doped region having a second net peak doping concentration and a third doped region having a third net peak doping concentration, the second and third net peak doping concentrations being a same doping concentration, the first doped region between and abutting the second and third doped regions, the second and third doped regions not abutting; forming a fourth doped region in the silicon layer, the fourth doped region having a fourth net peak doping concentration in the silicon layer, the fourth doped region abutting only the second doped region; forming a fifth doped region in the silicon layer, the fifth doped region having a fifth net peak doping concentration in the silicon layer, the fifth doped region abutting only the third doped region; wherein a path of current flow from the fourth doped region, through the second doped region, the first doped region and the third doped region to the fifth doped region, is in a single horizontal direction parallel to the horizontal plane.

BRIEF DESCRIPTION OF DRAWINGS

The features of the invention are set forth in the appended claims. The invention itself, however, will be best understood by reference to the following detailed description of an illustrative embodiment when read in conjunction with the accompanying drawings, wherein:

DETAILED DESCRIPTION OF THE INVENTION

CMOS devices comprise N-channel field effect transistors (NFETs) and P-channel field effect transistors (PFETs). NFETs are fabricated in a P-well with region of the P-well under a gate electrode comprising the channel of the NFET and N-doped source/drains formed in the P-well on either side of gate. PFETs are fabricated in an N-well with region of the N-well under a gate electrode comprising the channel of the PFET and P-doped source/drains formed in the N-well on either side of gate.

Figure 1A:
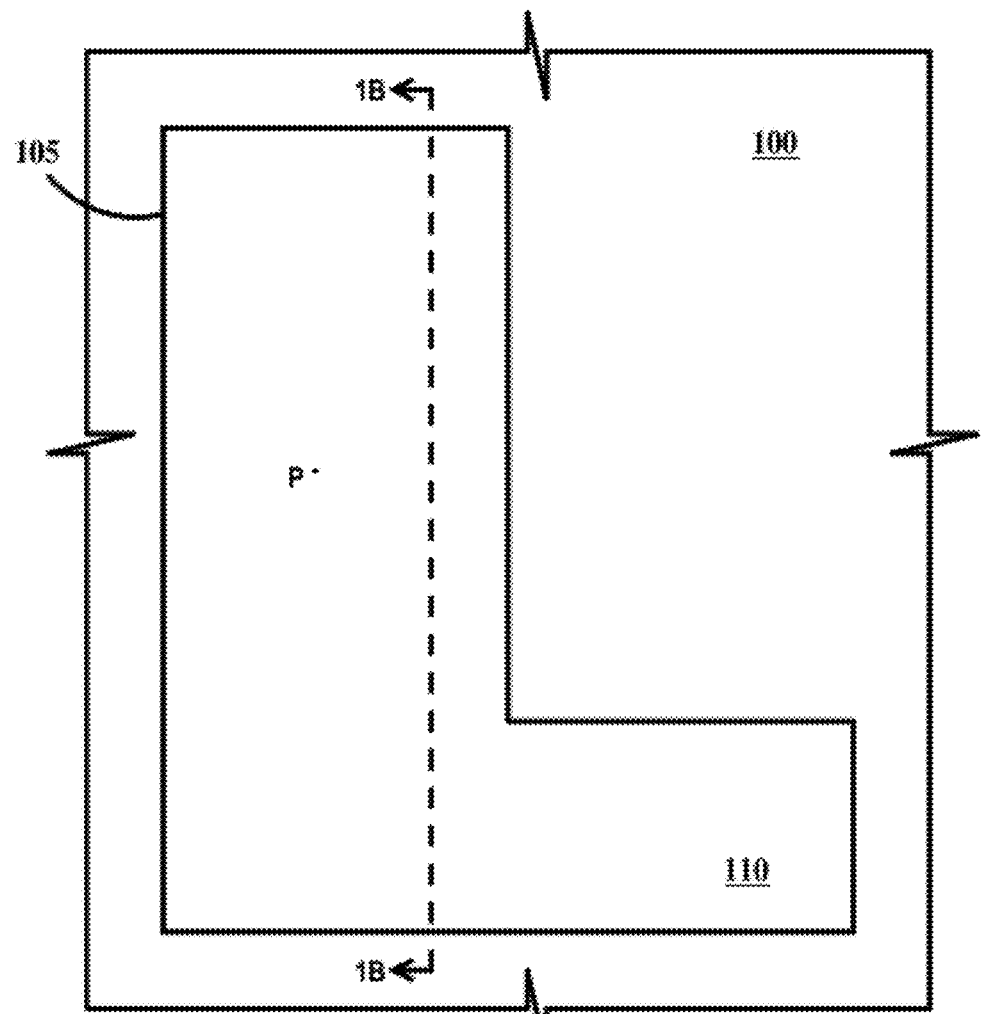
FIG. 1A is a plan view and 1B is a cross-section through line 1B-1B of FIG. 1A illustrating a first step in the fabrication of an SCR ESD protection device according to an embodiment of the present invention.

FIG. 1A is a plan view and 1B is a cross-section through line 1B-1B of FIG. 1A illustrating a first step in the fabrication of an SCR ESD protection device according to an embodiment of the present invention. In FIG. 1A, a region of shallow trench isolation (STI) 100 having a perimeter 105 surrounds a P-well 110.

Figure 1B:
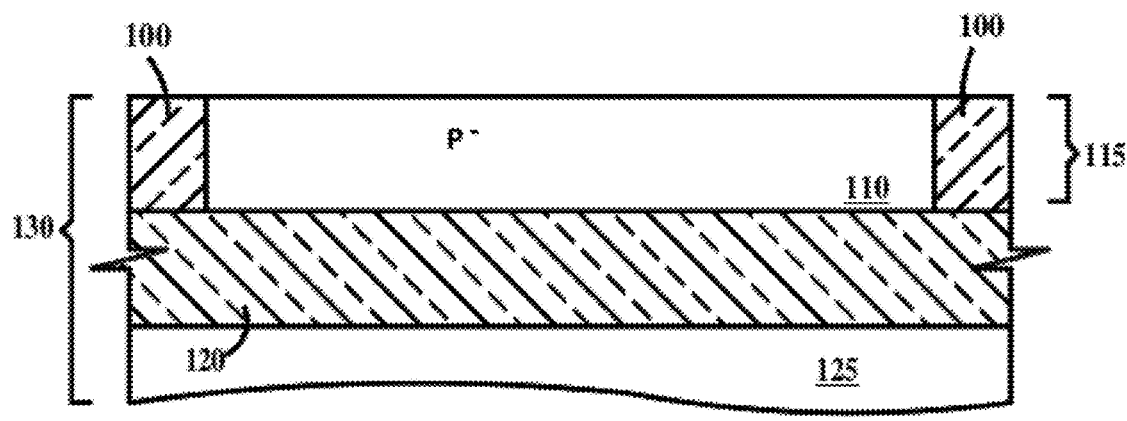

In FIG. 1B, it can be seen P-well 110 and STI 100 are formed in a single crystal silicon layer 115. Silicon layer 115 is formed in over a buried oxide layer (BOX) 120. BOX 120 is formed over a bulk silicon substrate 125. Silicon layer 115, BOX 120 and substrate 125 comprise an SOI substrate 130.

BOX 110 may be formed by forming a patterned mask over silicon layer 115, etching away regions of the silicon layer not protected by the patterned mask down to BOX 120, depositing an oxide to back fill the regions of silicon layer etched away and performing a chemical-mechanical polish (CMP) so that a top surface of P-well 110 is coplanar with a top surface of STI 100. The patterned mask, may be a hard-mask, for example, a patterned layer of silicon nitride ($Si_3N_4$) that itself was patterned using a photolithographic process. Silicon layer 115 may be etched, for example, by reactive ion etching (RIE).

P-well 110 may be formed by ion-implantation of a boron species, in one example, implantation of $BF_2$. The boron ion-implantation may be performed through a thin oxide layer (not shown in FIG. 1B). In one example, P-well 110 has a peak boron concentration between about 2E18 atoms/cm$^3$ and about 7E18 atoms/cm$^3$. A peak dopant concentration is the highest concentration of a dopant within a given region.

Formation of P-well 110 may be performed simultaneously with formation of the P-wells of CMOS NFETs used in the functional circuits of an integrated circuit to be protected by the SCR ESD protection device whose fabrication is being described.

Figure 2A:
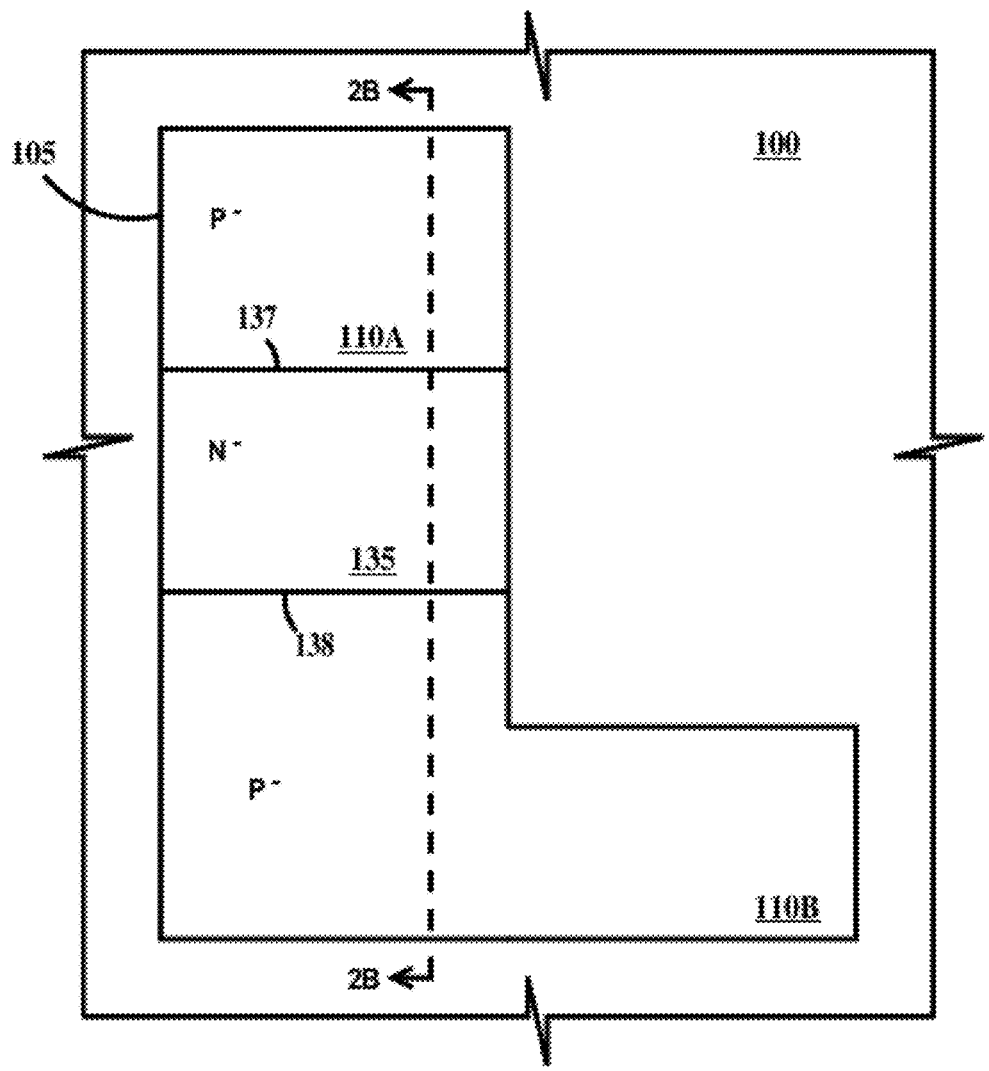
FIG. 2A is a plan view and 2B is a cross-section through line 2B-2B of FIG. 2A illustrating a second step in the fabrication of an SCR ESD protection device according to an embodiment of the present invention.
Figure 2B:
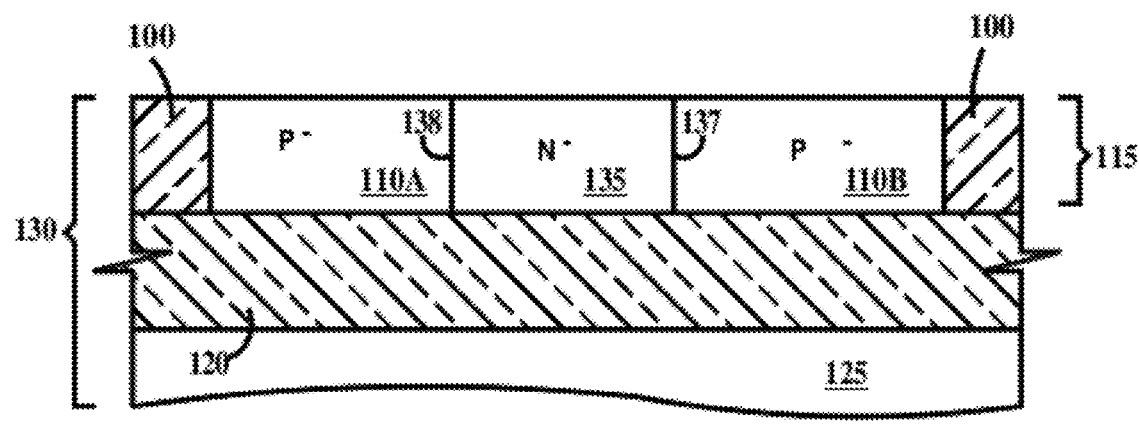

FIG. 2A is a plan view and 2B is a cross-section through line 2B-2B of FIG. 2A illustrating a second step in the fabrication of an SCR ESD protection device according to an embodiment of the present invention. In FIGS. 2A and 2B, an N-well region 135 is formed in silicon layer 115. N-well region 135 divides P-well 110 (see FIGS. 1A and 1B) into a first P-well region 110A and a second P-well region 110B. A first side of N-well region 135 abuts first P-well region 110A along a first PN junction 137 and an opposite second side of N-well region 135 abuts first P-well region 110B along a second PN junction 138.

N-well region 135 may be formed by forming a patterned photoresist mask over silicon layer 115, ion implanting an N-type dopant species into the silicon layer where the silicon layer is not protected by the photoresist mask and then removing the photoresist mask.

N-well 135 region may be formed by ion-implantation a N-dopant species, in one example, by ion implantation of arsenic (As). The As ion-implantation may be performed through a thin oxide layer (not shown in FIG. 2B). In one example, N-well 135 region has a peak boron concentration between about 6E17 atoms/cm$^3$ and about 1E18 atoms/cm$^3$.

Formation of N-well region 135 may be performed simultaneously with formation of the N-wells of CMOS PFETs used in the functional circuits of an integrated circuit to be protected by the SCR ESD protection device whose fabrication is being described.

Figure 3A:
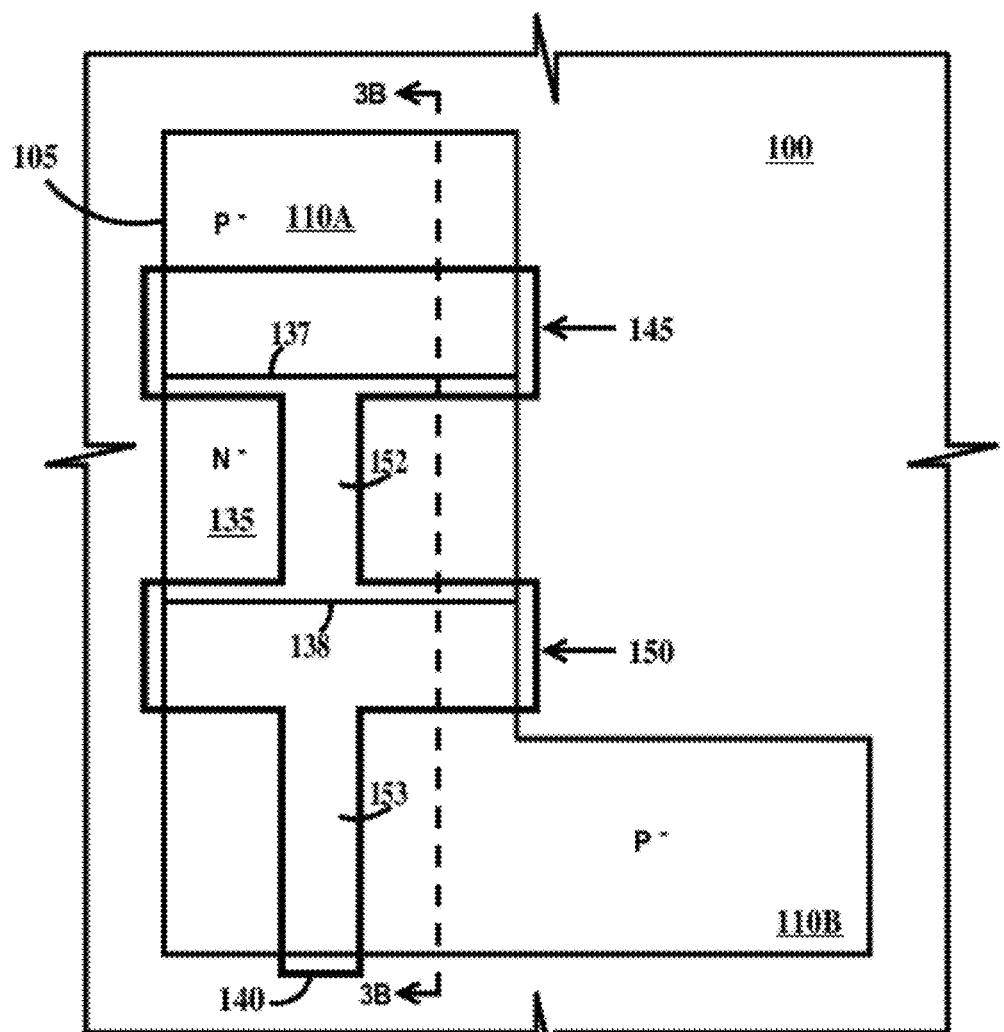
FIG. 3A is a plan view and 3B is a cross-section through line 3B-3B of FIG. 3A illustrating a third step in the fabrication of an SCR ESD protection device according to an embodiment of the present invention.

FIG. 3A is a plan view and 3B is a cross-section through line 3B-3B of FIG. 3A illustrating a third step in the fabrication of an SCR ESD protection device according to an embodiment of the present invention. In FIG. 3A, a gate stack 140 is formed over first P-well region 110A, second P-well region 110B and N-well region 135. A first gate region 145 of gate stack 140 overlaps first P-well region 110A and the first side of N-well region 135 (PN junction 137). A second gate stack region 150 of gate stack 140 overlaps second P-well region 110B and the second side of N-well region 135 (PN junction 138).

First and second gate stack regions 145 and 150 extend parallel to each other. First and second gate stack regions 145 and 150 are connected by an integrally formed spine 152 perpendicular to the first and second gate stack regions. A second integrally formed spine 153 extends perpendicular to second gate stack region 150 on an opposite side of gate stack region from spine 152. Opposite ends of first gate stack region 145 and opposite ends of second gate stack region 150 overlap perimeter 105. Spine 152 does not overlap perimeter 105. The end of spine 153 not joined to second gate stack region 150 overlaps perimeter 105.

Figure 3B:
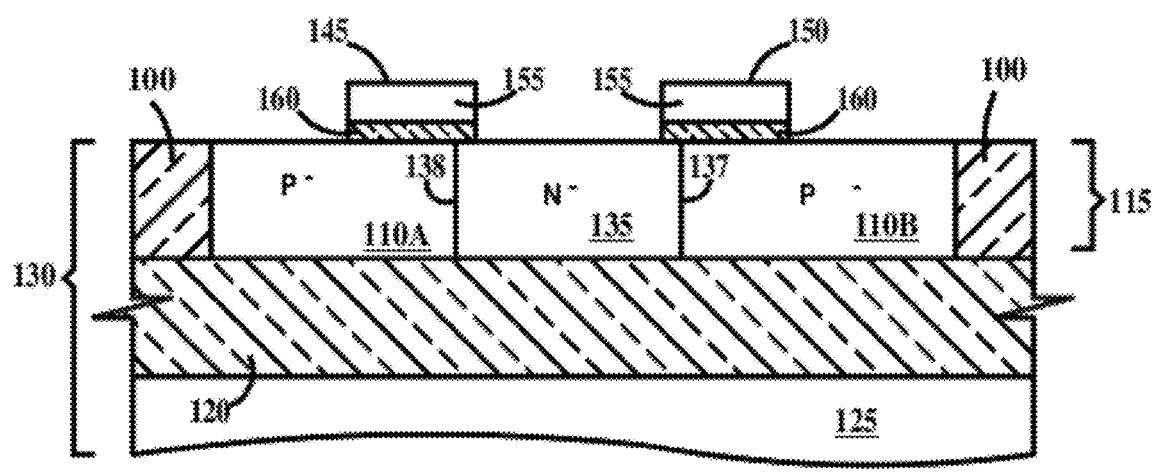

In FIG. 3B, first gate stack region 145 and second gate stack region 150 comprise a polysilicon layer 155 over a gate dielectric layer 160. Though gate dielectric layer 160 is shown only under first and second gate stack regions 145 and 150, the gate dielectric layer may extend over the entire top of surface of silicon layer 115.

Gate stack 140 may be formed by forming a blanket gate dielectric layer over silicon layer 115, forming a blanket polysilicon layer over the gate dielectric layer, forming a patterned photoresist mask over the blanket polysilicon layer, etching away regions of the blanket polysilicon silicon layer not protected by the patterned photoresist mask down to the blanket dielectric layer to form a patterned polysilicon layer, removing the photoresist mask and optionally etching away the blanket dielectric layer not protected by the patterned polysilicon. The blanket polysilicon layer may be etched, for example, using an RIE. The blanket gate dielectric may be etched, for example, using an RIE or by wet etching.

Formation of gate stack 140 may be performed simultaneously with formation of the gate electrodes of CMOS PFETs and/or NFETs used in the functional circuits of an integrated circuit to be protected by the SCR ESD protection device whose fabrication is being described.

Figure 4A:
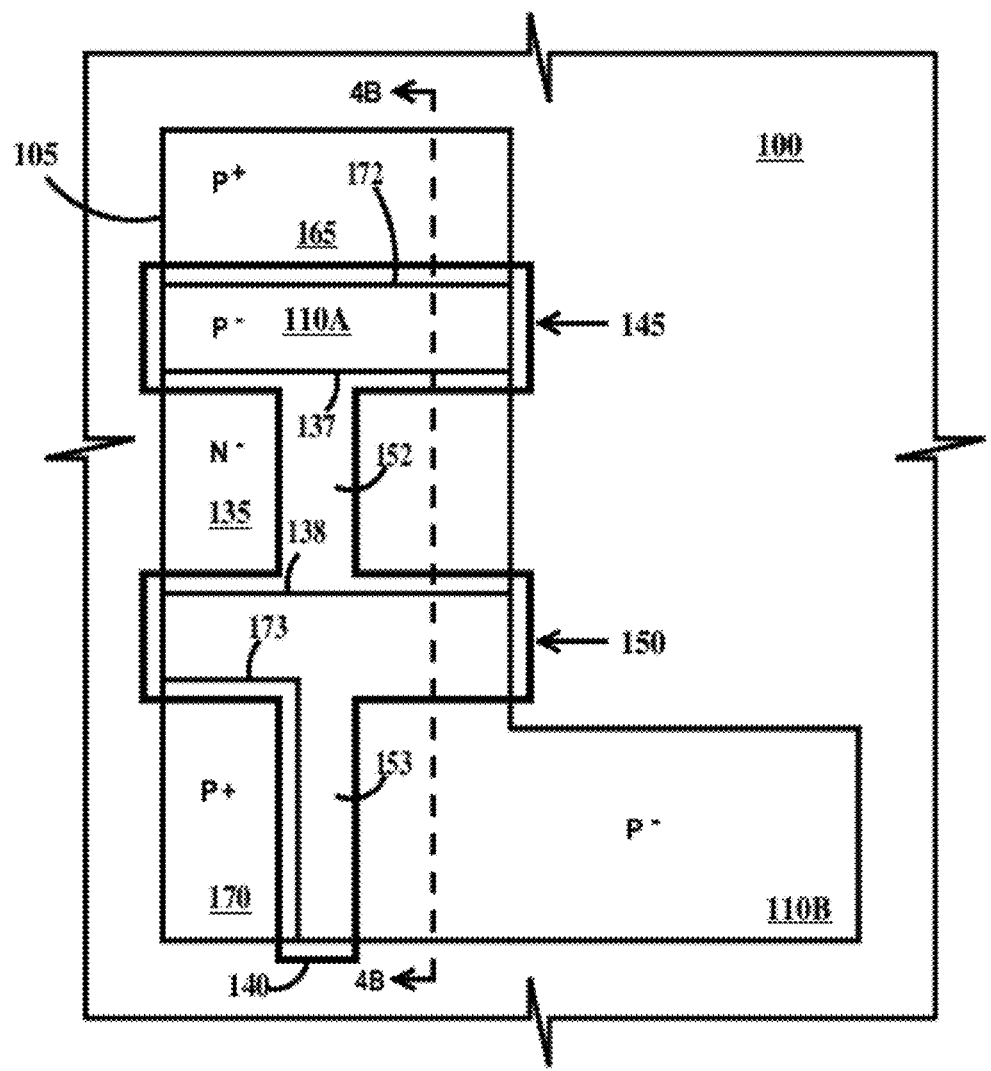
FIG. 4A is a plan view and 4B is a cross-section through line 4B-4B of FIG. 4A illustrating a fourth step in the fabrication of an SCR ESD protection device according to an embodiment of the present invention.
Figure 4B:
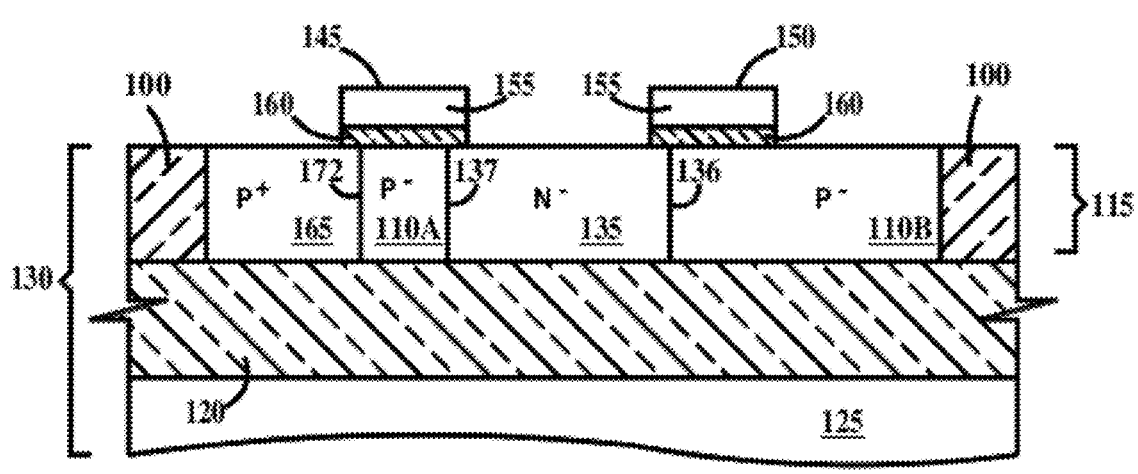

FIG. 4A is a plan view and 4B is a cross-section through line 4B-4B of FIG. 4A illustrating a fourth step in the fabrication of an SCR ESD protection device according to an embodiment of the present invention. In FIGS. 4A and 4B, highly doped first and second P-type regions 165 and 170 are formed in silicon layer 115. First P-type region 165 is formed in a region of first P-well region 110A. A portion of first P-well 110A region remains between N-well region 135 and first P-type region 165 under first gate stack region 145. An interface 172 separates the remaining first P-well region 110A from first P-type region 165. An interface 173 separates the remaining second P-well region 110B from second P-type region 170.

First and second P-type regions 165 and 170 may be formed by forming a patterned photoresist mask over silicon layer 115, ion implanting a P-type dopant species into the silicon layer where the silicon layer is not protected by the photoresist mask or gate stack 140 and then removing the photoresist mask.

First and second P-type regions 165 and 170 may be formed by ion-implantation of a boron species, in one example, implantation of $BF_2$. The boron ion-implantation may be performed through a thin oxide layer (not shown in FIG. 4B). In one example, first and second P-type regions 165 and 170 have a peak boron concentration between about 1E20 atoms/cm$^3$ and about 2E20 atoms/cm$^3$.

Figure 5A:
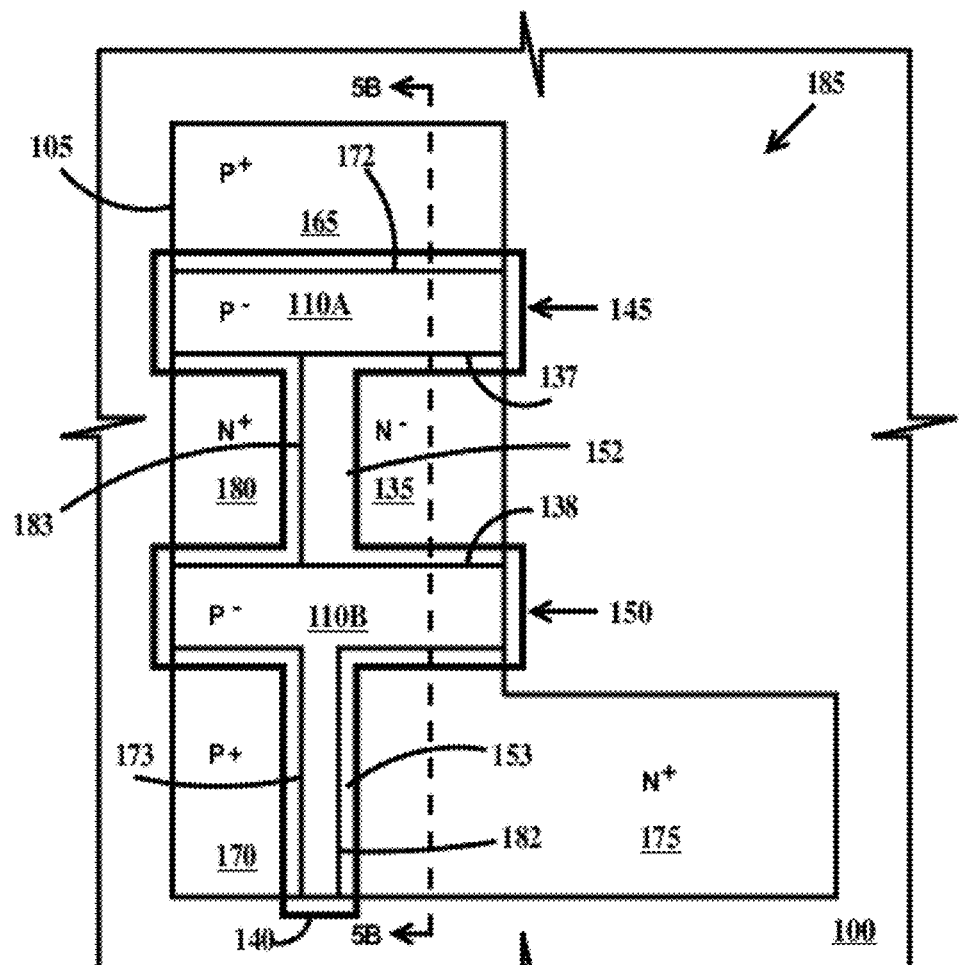
FIG. 5A is a plan view and 5B is a cross-section through line 5B-5B of FIG. 5A illustrating a fifth step in the fabrication of an SCR ESD protection device according to an embodiment of the present invention.
Figure 5B:
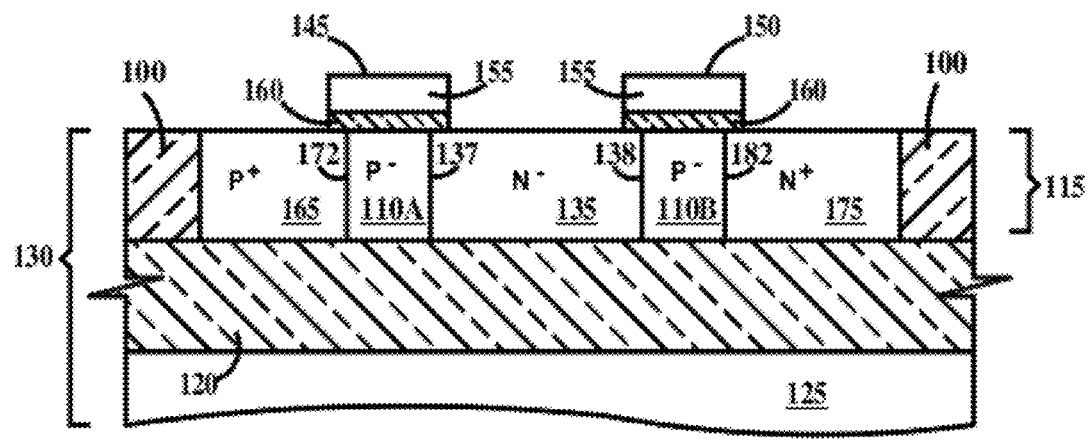

Formation of first and second P-type regions 165 and 170 may be performed simultaneously with formation of the source/drains of CMOS PFETs used in the functional circuits of an integrated circuit to be protected by the SCR ESD protection device whose fabrication is being described FIG. 5A is a plan view and 5B is a cross-section through line 5B-5B of FIG. 5A illustrating a fifth step in the fabrication of an SCR ESD protection device according to an embodiment of the present invention. In FIGS. 5A and 5B, highly doped first and second N-type regions 175 and 180 are formed in silicon layer 115. A portion of first P-well 110A region remains between second P-type region 170 and first N-type region 175 under spine 152 of gate stack 140 and remains between first N-type region 175 and second P-well region 110B under second gate stack region 150. A PN junction 182 separates the remaining second P-well region 110B from first N-type region 175. Second N-type region 180 is formed between first and second P-well regions 110A and 110B and abuts first N-type region 135 along an interface 183 and PN junctions 137 and 138.

First and second N-type regions 175 and 180 may be formed by forming a patterned photoresist mask over silicon layer 115, ion implanting an N-type dopant species into the silicon layer where the silicon layer is not protected by the photoresist mask or gate stack 140 and then removing the photoresist mask.

First and second N-type regions 175 and 180 may be formed by ion-implantation of phosphorus. The phosphorus ion-implantation may be performed through a thin oxide layer (not shown in FIG. 5B). In one example, first and second N-type regions 175 and 180 have a peak boron concentration between about 1E20 atoms/cm$^3$ and about 2E20 atoms/cm$^3$.

Formation of first and second N-type regions 175 and 180 may be performed simultaneously with formation of the source/drains of CMOS NFETs used in the functional circuits of an integrated circuit to be protected by an SCR ESD protection device (herein after SCR) 185 whose fabrication is now essentially complete.

It should be understood that the various PN junctions 137, 138 and 182 and interfaces 172, 173 and 183 are illustrated under gate stack 140. Even though edges of gate stack 140 are used to define PN junctions 137, 138 and 182 and interfaces 172, 173 and 183, various heat cycles and other processes cause the dopants to diffuse under the gate stack. Also, structures such as sidewall spacers (well known in the art) on the sides of gate stack 140 may be present before or after the various ion implantations processes described but have not been shown for clarity. Sides of gate stack 140 project in a vertical plane perpendicular to the plane of the paper of, for example, FIG. 5A.

Figure 6:
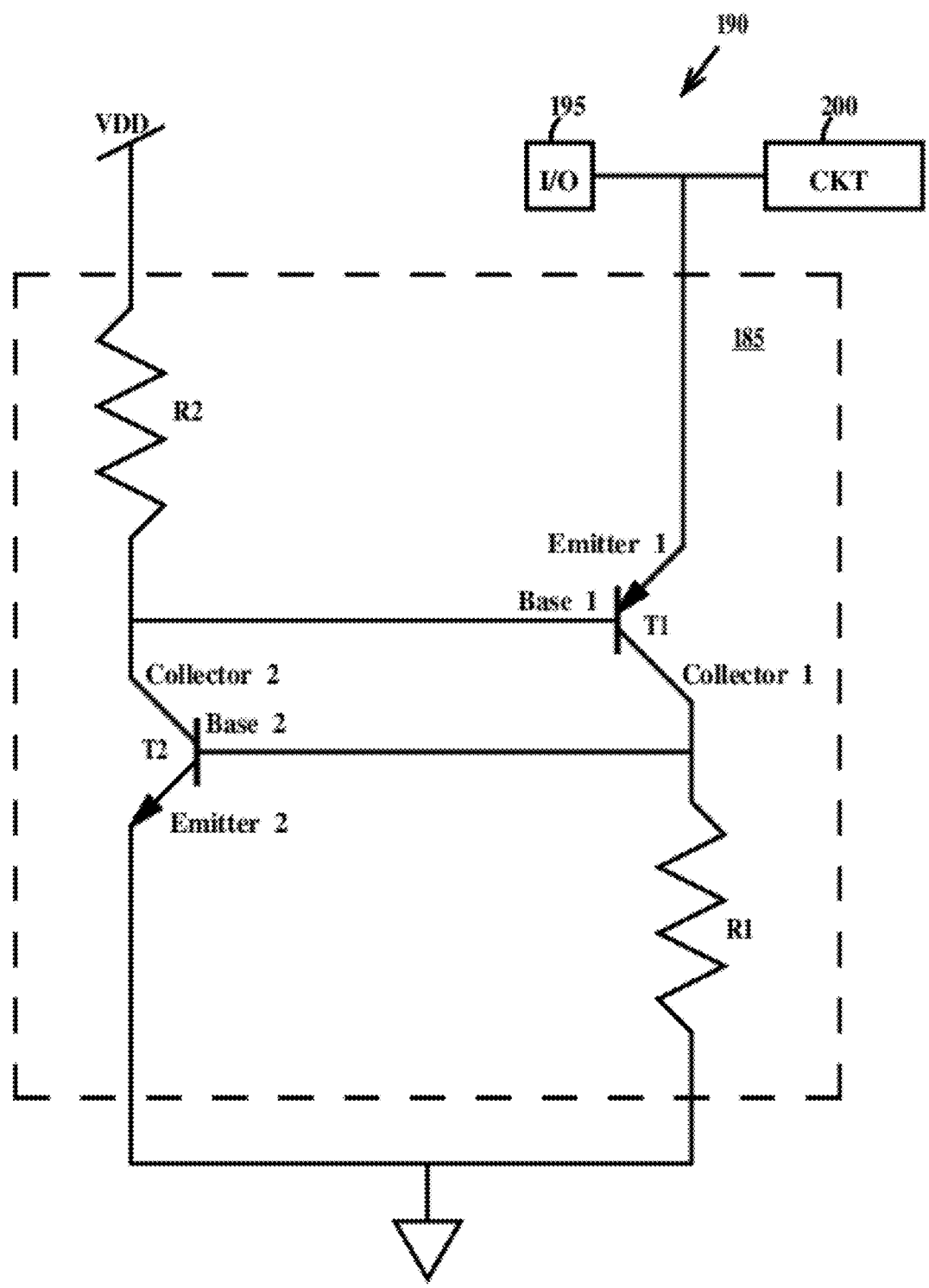
FIG. 6 is a schematic diagram of an ESD protection circuit according to an embodiment of the present invention.

FIG. 6 is a schematic diagram of an ESD protection circuit 190 according to an embodiment of the present invention. In FIG. 6, ESD protection circuit 190 includes SCR 185, an I/O pad 195 and circuit(s) 200 of an integrated circuit to be protected. SCR 185 comprises a bipolar PNP transistor T1, an NPN bipolar transistor T2 and first and second resistors R1 and R2. A first terminal of resistor R2 is connected to VDD and a second terminal of resistor R2 is connected to the base of transistor T1 and the collector of transistor T2. The emitter of transistor T1 is connected to I/O pad 195 and circuit(s) 200. The collector of transistor T1 is connected to the base of transistor T2 and a first terminal of resistor R1. A second terminal of resistor R1 and the emitter of transistor T2 are connected to ground.

Figure 7A:
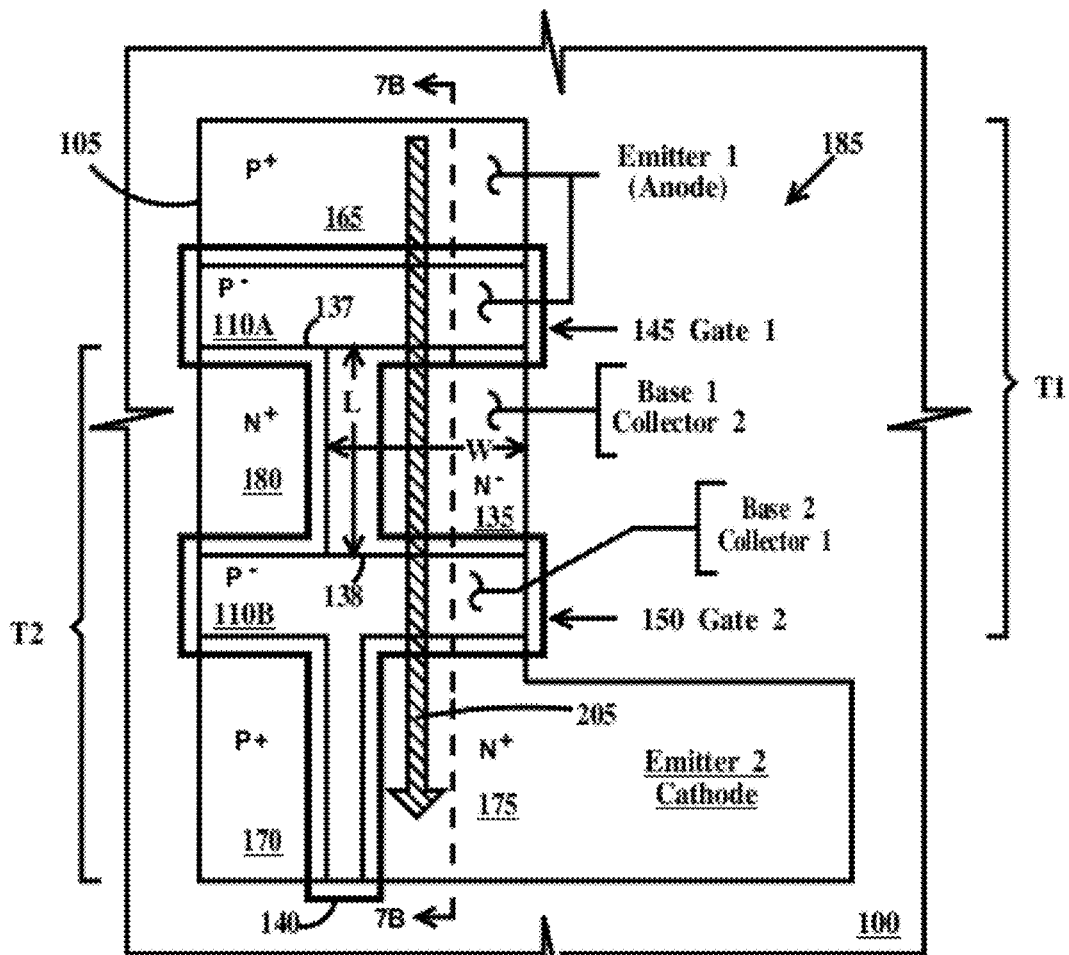
FIG. 7A is a plan view and 7B is a cross-section through line 7B-7B of FIG. 7A illustrating the ESD protection circuit of FIG. 5 superimposed over the SCR ESD protection device illustrated in FIGS. 5A and 5B.

FIG. 7A is a plan view and 7B is a cross-section through line 7B-7B of FIG. 7A illustrating the ESD protection circuit of FIG. 5 superimposed over SCR 185 illustrated in FIGS. 5A and 5B. In FIG. 7A, first transistor T1 comprises first P-type region 165 and first P-well region 110A as the emitter of transistor T1, N-well region 135 as the base of transistor T1 and second P-well region 110B as the collector of transistor T1. Second transistor T2 comprises first N-type region 175 a as the emitter of transistor T2, second P-well region 110B as the base of transistor T2 and N-well region 135 as the collector of transistor T2. First P-type region 165 may be considered an anode and first N-type region 175 may be considered the cathode of SCR 185.

Second P-type region 170 may be used to provide contact to first P-well region 110B which is located under gate stack 140 as well as being lightly doped Second N-type region 180 may be used to contact N-well region 135 which is lightly doped. A wire contacting lightly doped silicon (i.e. less than about 1E18 dopant atm/cm$^3$) results in a high resistance contact, while a wire contacting highly doped silicon (i.e. greater than about 1E18 dopant atm/cm$^3$) results in a lower resistance contact. A metal silicide layer formed on the top surface of silicon regions, as is known in the art, may be used to further reduce contact resistance. Care must be taken to avoid shorts to gate stack 140, for example, by forming dielectric spacers on the sidewalls of gate stack 140.

Figure 7B:
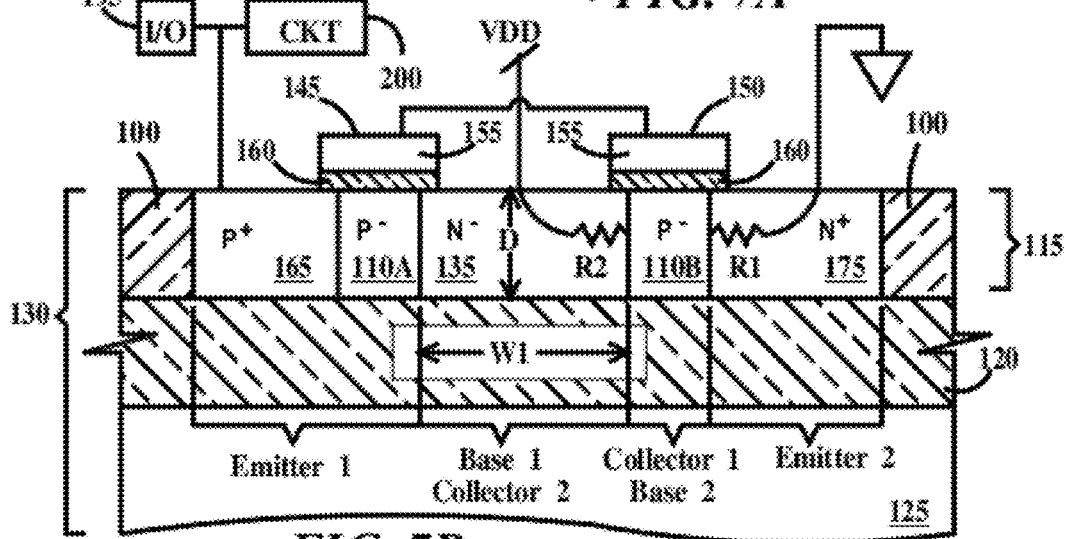

In FIG. 7B, it can be seen that first P-type region 165 is connected to I/O pad 195 and circuit(s) 200. First N-type region 175 is connected to ground and N-well region 135 is connected to VDD. Connections to I/O 195, circuit(s) 200, VDD and ground are by wires or metal contact studs (not shown) contacting first P-type region 165, and N-type region 180 (which is physically touching and electrically connected to N-well region 135) and first N-type region 175 respectfully. A metal silicide layer as described supra (not shown) may be formed on the top surfaces of first P-type region 165, N-well region 135 and first N-type region 175 to ensure a low resistance contact (also known as an ohmic contact). Also resistor R1 is seen to be the internal resistance of first N-type region 175 and resistor R2 is seen to be the internal resistance of N-well 135.

Gates 145 and 150 are not functional elements of SCR 185. In one example, gates 145 and 150 are floating. In another example gates 145 and 150 are connected to ground. With gate 145 and 150 grounded, there will be some current leakage between N-well region 135 and first N-type region 175.

Charge dissipation current flow in SCR 185 is from first P-type region 165 (the anode of the SCR) through first P-well region 110A, N-well region 135, second P-well region 110B to first N-type region 175 along a current path 205. Current path 205 is a single straight line current path in a first horizontal direction defined by line 7B-7B and all planes parallel to a plane defined by the top surface of silicon layer 115. Current flow in SCR 185 is only in a single horizontal direction as opposed to prior art SCR devices where the current must turn about 90° from emitter 1 to the base/collectors and another 90° from the base/collectors to emitter 2. Thus, in the prior art devices, charge dissipation current is flowing in two different horizontal directions. The change in horizontal direction of current flow in prior art SCRs cause current crowding, limiting the amount of charge that can be dissipated.

The speed of turn on of SCR 185 is controlled by distance L (in the first horizontal direction between PN junction 137 and PN junction 138: the larger the value of L, the slower the turn on of SCR 185; the smaller the value of L, the faster the turn on of SCR 185. In one example L is between about 100 and 250 nm. W is the width (in the second horizontal direction) of N-well region 135 and along with the depth D (in a vertical direction) and the doping concentration of the N-well region controls the amount of current SCR 185 can carry. W, L and D are mutually orthogonal.

Figure 8:
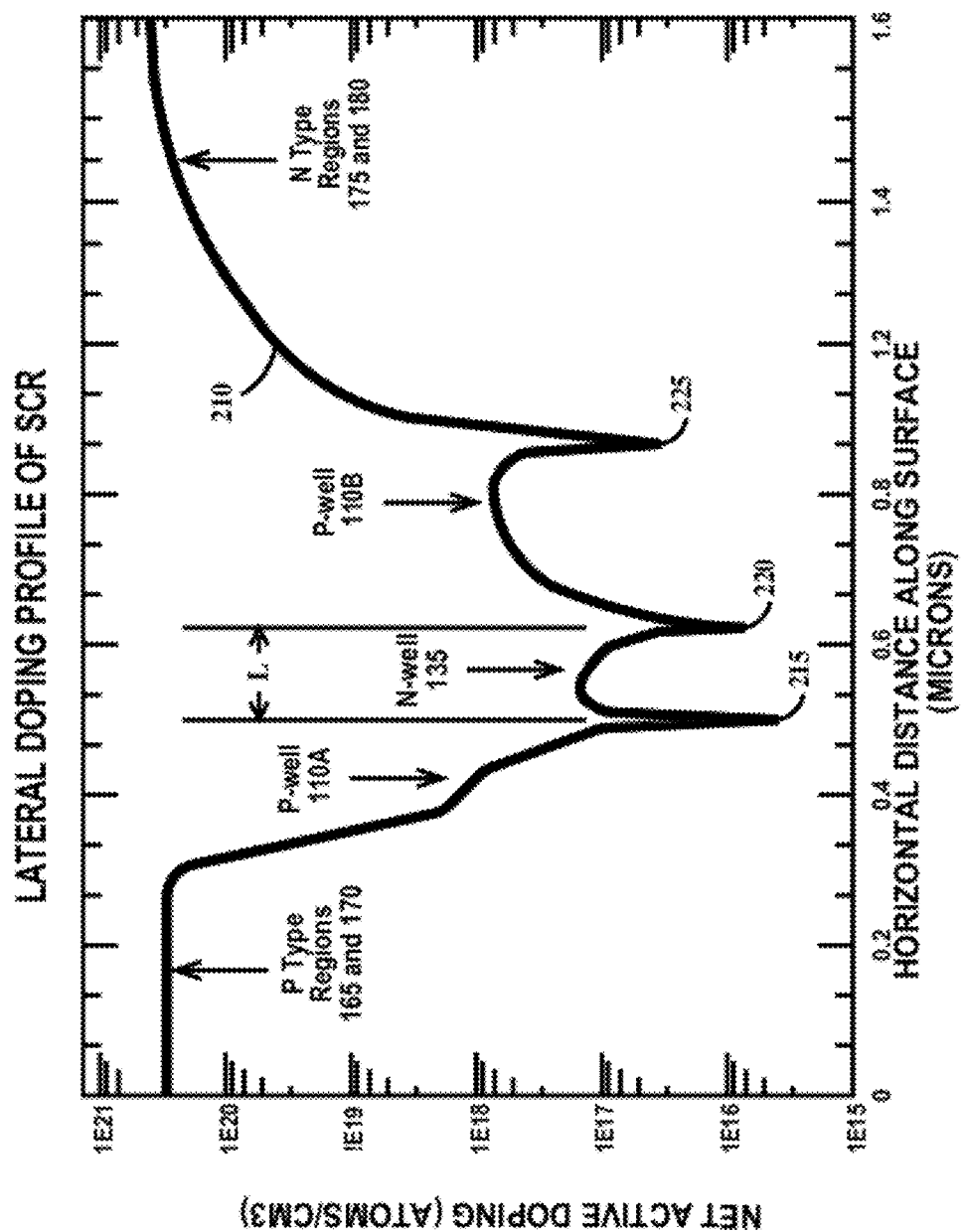
FIG. 8 is a simulated lateral profile of an SCR ESD protection device according to the embodiments of the present invention.

FIG. 8 is a simulated lateral profile of an SCR ESD protection device according to the embodiments of the present invention. The term lateral direction refers to a direction parallel to the first horizontal direction (and not to the second horizontal direction) as described supra. A peak concentration is a maximum doping concentration in a given region. A net doping concentration is the difference between the doping concentrations of a first dopant type and a second and opposite dopant type, the concentration of the first dopant type being greater than the concentration of the second dopant type. Thus, a net peak doping concentration is the maximum difference between the doping concentration of a first dopant type less the doping concentration of a second dopant type, the concentration of the first dopant type being greater than the concentration of the second dopant type. The concentration of the second dopant type may be zero. The terms doped P-type or doped N-type should be understood to mean net doping. For example, a region having both N- and P-type dopants, with a higher concentration of N-type dopant than P-type dopant would be considered to be doped N-type and vice versa.

In FIG. 8, curve 210 represents an approximate and exemplary lateral doping profile for SCR 185 of FIG. 7A. Point 215 marks the PN junction between the portions of SCR 185 formed from P-type region 165 and first P-well region 110A (see FIG. 7A) and N-well region 135 (see FIG. 7A). Point 220 marks the PN junction between the portions of SCR 185 formed from N-well region 135 (see FIG. 7A) and P-well region 110B (see FIG. 7A). Point 225 marks the PN junction between the portions of SCR 185 formed from P-well region 110B (see FIG. 7A) and N-type region 175 (see FIG. 7A).

In one example, the peak doping concentrations of P-type region 165 and N-type regions 175 are advantageously each greater than a peak doping concentration of N-well region 135 and a peak doping concentration of P-well region 110B. In one example, the peak doping concentration of P-well region 110B is advantageously greater than the peak doping concentration of N-well region 135. In one, example, the peak doping concentrations of P-type region 165 and N-type regions 175 are advantageously each at least two orders of magnitude greater than the peak doping concentrations of both said P-well region 110B and said N-well region 135.

Thus, the embodiments of the present invention provide an SCR device for ESD protection in integrated circuits fabricated on silicon-on-insulator SOI substrates.

The description of the embodiments of the present invention is given above for the understanding of the present invention. It will be understood that the invention is not limited to the particular embodiments described herein, but is capable of various modifications, rearrangements and substitutions as will now become apparent to those skilled in the art without departing from the scope of the invention. Therefore, it is intended that the following claims cover all such modifications and changes as fall within the true spirit and scope of the invention.

What is claimed is:

1. A silicon control rectifier, comprising:
   silicon body formed in a silicon layer in direct physical contact with a buried oxide layer of a silicon-on-insulator substrate, a top surface of said silicon layer defining a horizontal plane;
   an anode of said silicon control rectifier formed in a first region of said silicon body and a cathode of said silicon control rectifier formed in an opposite second region of said silicon body;
   a doped third region and a doped fourth region, said third region between and abutting said first and fourth regions, said fourth region between and abutting said second and third regions, said third region not abutting said second region, said fourth region not abutting said first region, said first and fourth regions doped an opposite type from said second and said second and third regions, second, third and fourth regions in direct physical contact with said buried oxide layer;
   a single contiguous gate electrode having (i) a first portion overlapping a less than whole portion of said first region and a less than whole portion of said third region and (ii) a second portion overlapping a less than whole portion of said second region, overlapping a less than whole portion of said third region and overlapping all of said fourth region between said second and third regions;
   wherein a path of current flow from said anode to said cathode passes through said third and fourth regions is only in a single horizontal direction parallel to said horizontal plane.

2. The silicon control rectifier of claim 1, wherein said first region is doped P-type and said second region is doped N-type.

3. The silicon control rectifier of claim 2, wherein said third region is doped N-type and said fourth region is doped P-type.

4. The silicon control rectifier of claim 3:
   wherein a net peak doping concentration of said first region is greater than a net peak doping concentration of said third region and a net peak doping concentration of said fourth region; and
   wherein a net peak doping concentration of said second region is greater than said net peak doping concentration of said third region and said net peak doping concentration of said fourth region.

5. The silicon control rectifier of claim 4, wherein said net peak doping concentration of said fourth region is greater than said net peak doping concentration of said third region.

6. The silicon control rectifier of claim 4, wherein said net peak doping concentrations of said first and second regions are both at least two orders of magnitude greater than said net peak doping concentrations of both of said third and fourth regions.

7. The silicon control rectifier of claim 1, wherein said first region includes a highly doped region and a less highly region of the same dopant type as said highly doped region, said less highly doped region between and abutting said highly doped P-type region and said third region.

8. The silicon control rectifier of claim 7, further including:
   said first portion of said gate electrode overlapping a less than whole portion of said less highly doped region, said less highly doped region contained completely under said first portion of said gate electrode; and said second portion of said gate electrode over said fourth region, said fourth region contained completely under said second polysilicon gate.

9. The silicon control rectifier of claim 7, wherein said highly doped region and said less highly doped region are doped P-type.

10. The silicon control rectifier of claim 1, wherein said gate electrode is floating said second region is connected to ground, and said third region is connected to VDD.

* * * * *